(12) United States Patent
Gotoda et al.

(10) Patent No.: US 8,680,548 B2
(45) Date of Patent: Mar. 25, 2014

(54) SEMICONDUCTOR LIGHT EMITTING DEVICE AND METHOD OF FABRICATING SEMICONDUCTOR LIGHT EMITTING DEVICE

(75) Inventors: Toru Gotoda, Yokohama (JP); Hajime Nago, Yokohama (JP); Toshiyuki Oka, Yokohama (JP); Kotaro Zaima, Tokyo (JP); Shinya Nunoue, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 244 days.

(21) Appl. No.: 12/874,568

(22) Filed: Sep. 2, 2010

(65) Prior Publication Data
US 2011/0220934 A1 Sep. 15, 2011

(30) Foreign Application Priority Data
Mar. 9, 2010 (JP) ................. 2010-052209

(51) Int. Cl.
*H01L 33/00* (2010.01)
(52) U.S. Cl.
USPC 257/98; 257/103; 257/E33.023; 257/E33.058
(58) Field of Classification Search
USPC .............. 257/98, 103, E33.023, E33.058
See application file for complete search history.

(56) References Cited

U.S. PATENT DOCUMENTS

| 2006/0202223 | A1* | 9/2006 | Sackrison et al. | 257/99 |
| 2009/0101929 | A1 | 4/2009 | Mo et al. | |
| 2009/0294953 | A1* | 12/2009 | Hwan et al. | 257/699 |
| 2011/0316011 | A1* | 12/2011 | Ito et al. | 257/88 |

FOREIGN PATENT DOCUMENTS

| JP | 2004-221163 | 8/2004 |
| JP | 2006-8956 | 1/2006 |
| JP | 2008-140673 | 6/2008 |
| JP | 2008-297373 | 12/2008 |
| TW | 200629605 A | 8/2006 |
| TW | 200802926 | 1/2008 |
| WO | WO 2009/053916 A1 | 4/2009 |

OTHER PUBLICATIONS

U.S. Appl. No. 12/874,399, filed Sep. 2, 2010, Gotoda, et al.
U.S. Appl. No. 12/874,625, filed Sep. 2, 2010, Gotoda, et al.
U.S. Appl. No. 12/874,425, filed Sep. 2, 2010, Zaima, et al.
U.S. Appl. No. 12/874,475, filed Sep. 2, 2010, Zaima, et al.
U.S. Appl. No. 12/728,841, filed Mar. 22, 2010, Ando, et al.
Office Action issued Feb. 14, 2012, Japanese Patent Application No. 2010-052209 with English translation.
Office Action issued in Dec. 27, 2012, in Chinese Patent Application No. 201010275105.X, (with English-language Translation).
Chinese Office Action issued Aug. 21, 2013, in China Patent Application No. 201010275105.X (with English translation).
Office Action issued Oct. 16, 2013, in Taiwanese Patent Application No. 099129917 (with English-language Translation).

* cited by examiner

*Primary Examiner* — Tan N Tran
(74) *Attorney, Agent, or Firm* — Oblon, Spivak, McClelland, Maier & Neustadt, L.L.P.

(57) ABSTRACT

A semiconductor light emitting device has a support substrate, a light emitting element, and underfill material. The light emitting element includes a nitride-based group III-V compound semiconductor layer contacted via a bump on the support substrate. The underfill material is disposed between the support substrate and the light emitting element, the underfill material comprising a rib portion disposed outside of an end face of the light emitting element to surround the end surface of the light emitting element.

14 Claims, 3 Drawing Sheets

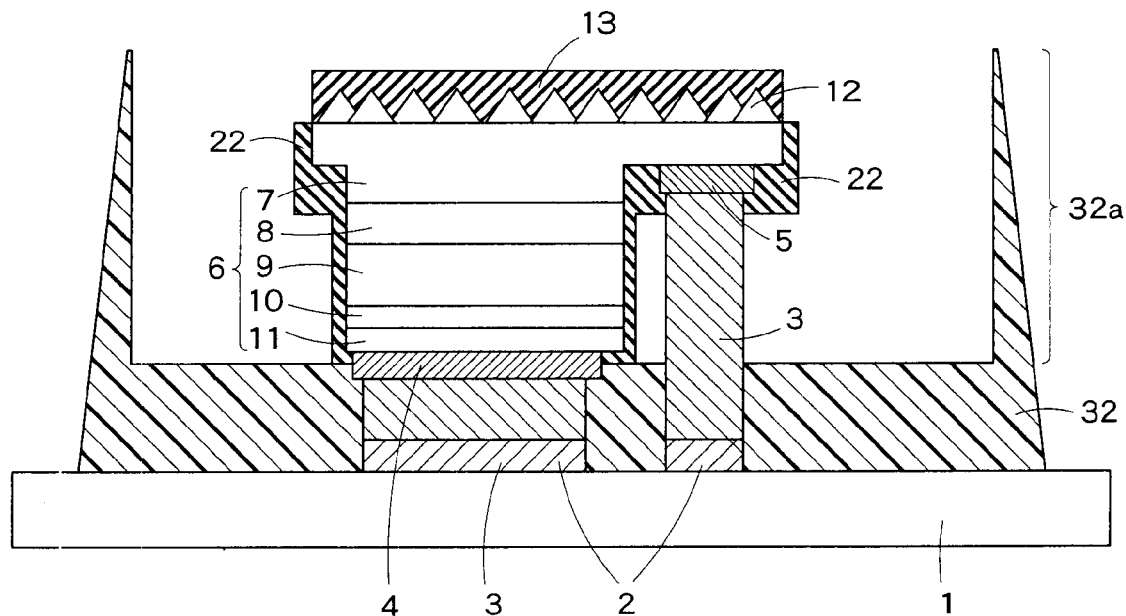
F I G. 1
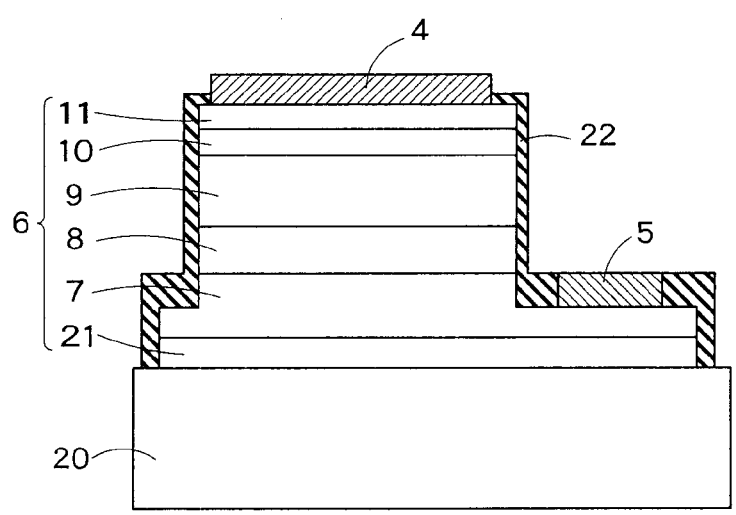
F I G. 2

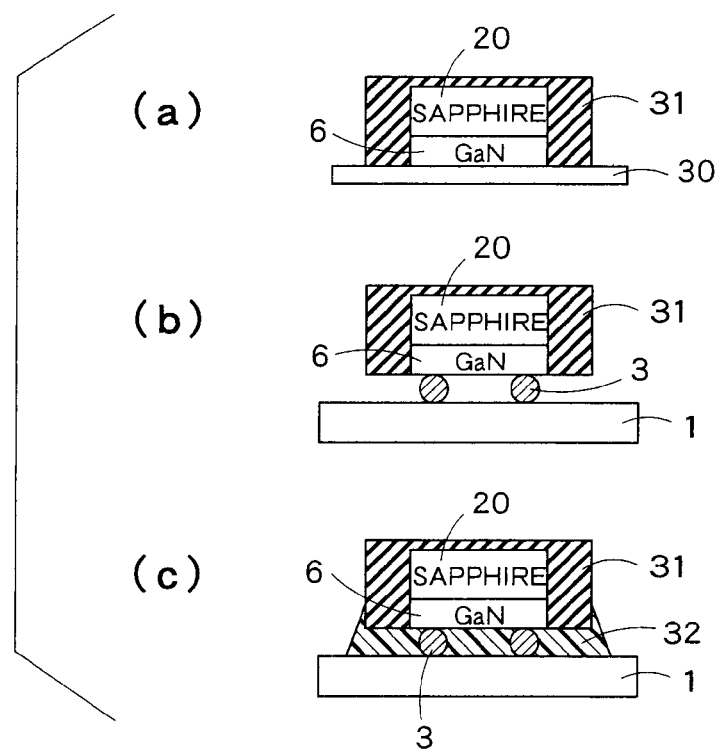
F I G. 3
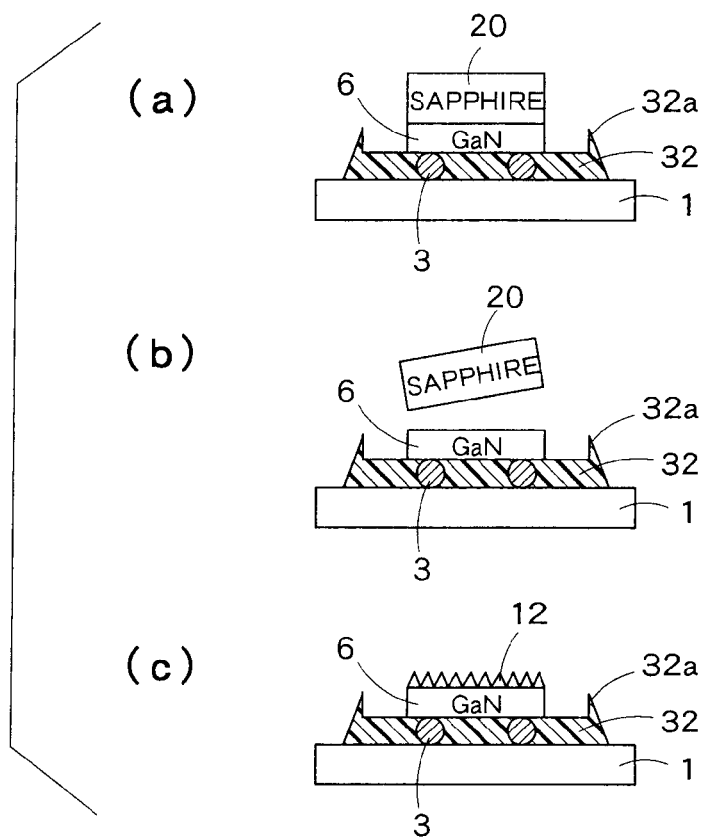
F I G. 4

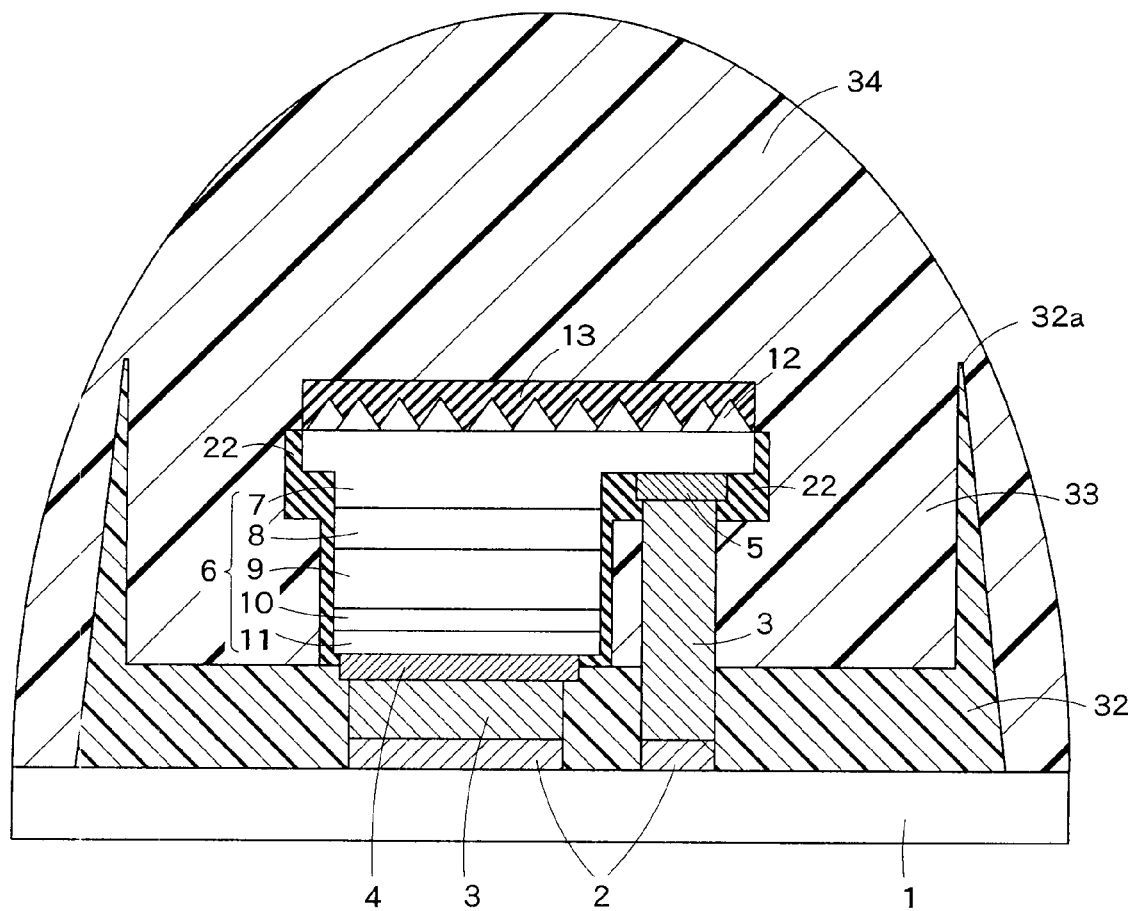
F I G. 5

SEMICONDUCTOR LIGHT EMITTING DEVICE AND METHOD OF FABRICATING SEMICONDUCTOR LIGHT EMITTING DEVICE

CROSS REFERENCE TO RELATED APPLICATIONS

This application is based upon and claims the benefit of priority from the prior Japanese Patent Application No. 2010-52209, filed on Mar. 9, 2010, the entire contents of which are incorporated herein by reference.

FIELD

The present embodiment relates to a semiconductor light emitting device using a nitride-based group III-V compound semiconductor and a method of fabricating a semiconductor light emitting device.

BACKGROUND

Optical devices, such as laser diodes (LD) and light emitting diodes (LED) can be fabricated by crystal growth of a nitride-based group III-V compound semiconductor on a sapphire substrate, a SiC substrate, etc. As technical problems for optical devices of this type, there are improvements in heat dissipation performance and light extraction efficiency. It has been difficult for optical devices of this type to operate stably when a large current is flown therethrough.

Recently, a semiconductor light emitting device aiming for higher light extraction efficiency has been proposed, in which a III-V compound semiconductor formed on a sapphire substrate is mounted on a sub-mount substrate by flip-chip mounting, and then the compound semiconductor is fixed with an underfill material, and then the sapphire substrate is peeled off from the semiconductor, and then an upper surface of the compound semiconductor processed to make a rough surface.

However, when the underfill material is attached to the side faces of the sapphire substrate, an excess force is required to peel off the sapphire substrate by the laser lift-off method. It is thus concerned that the compound semiconductor may crack when the sapphire substrate is peeled off forcibly.

For this reason, there has been proposed a technique in which the underfill material is not attached to the side faces of the sapphire substrate (see Document 1: JP-A 2008-140873 (Kokai).)

However, in Document 1, although the underfill material is not attached to the side faces of the sapphire substrate, it is attached to the bottom surface of the sapphire substrate. Thus, an excess force is also required in order to peel off the sapphire substrate. This could cause a compound semiconductor and/or the underfill material to crack or break. Moreover, in order to form the underfill material having the shape disclosed in Document 1, further fabrication processes are required which leads to increase in fabrication cost.

BRIEF DESCRIPTION OF THE DRAWINGS

FIG. 1 is a sectional view of a semiconductor light emitting device according to an embodiment;

FIG. 2 is a sectional view showing an example of a compound semiconductor layer 6 formed on a sapphire substrate 20;

FIG. 3 is a process view showing an example of a fabrication process of the semiconductor light emitting device of the present embodiment;

FIG. 4 is a process view following to FIG. 3; and

FIG. 5 is a sectional view of a packaged semiconductor light emitting device.

DETAILED DESCRIPTION

According to one embodiment, a semiconductor light emitting device has a support substrate, a light emitting element, and underfill material. The light emitting element includes a nitride-based group III-V compound semiconductor layer contacted via a bump on the support substrate. The underfill material is disposed on the support substrate to contact the support substrate, the light emitting element and the bump, the underfill material comprising a rib portion disposed outside of an end face of the light emitting element to surround the end surface of the light emitting element.

Embodiments will now be explained with reference to the accompanying drawings.

FIG. 1 is a sectional view of a semiconductor light emitting device according to an embodiment. The semiconductor light emitting device of FIG. 1 has a p-electrode layer 4 and an n-electrode layer 5 each connected to a sub-mount substrate 1 that becomes a support substrate, via a bonding metal layer 2 and a bump 3, respectively, and a nitride-based group III-V compound semiconductor layer (light emitting element) 6 connected to the p-electrode layer 4 and the n-electrode layer 5.

The compound semiconductor layer 6 has a laminated structure of an n-type contact layer 7, an n-type semiconductor layer 8, a light emitting layer 9, a p-type semiconductor layer 10, and a p-type contact layer 11 from above to below in FIG. 1. The layers in the compound semiconductor layer 6 are preferably formed with a GaN-based single crystal that grows on a sapphire substrate by crystal growth at high quality. A concrete material of the layers is, for example, $Al_xGa_{1-x-y}In_yN$ ($0 \leq x \leq 1$, $0 \leq y \leq 1$).

The upper surface of the n-type contact layer 7 is a light extraction surface 12 processed to make a rough surface for enhancing light extraction efficiency. Formed on the light extraction surface 12 is an insulating film 13 for relaxing the refractive index difference.

At the preceding step before the fabrication of the semiconductor light emitting device of FIG. 1, the compound semiconductor layer 6 grows on a sapphire substrate by crystal growth. FIG. 2 is a sectional view showing an example of the compound semiconductor layer 6 grown on a sapphire substrate 20 by crystal growth. In FIG. 2, the same reference numerals are given to the layers common to FIG. 1. The compound semiconductor layer 6 of FIG. 2 has a buffer layer 21, an n-type contact layer 7, an n-type semiconductor layer 8, a light emitting layer 9, a p-type semiconductor layer 10, and a p-type contact layer 11, laminated in order on the sapphire substrate 20. Formed on the p-type contact layer 11 is a p-electrode layer 4, whereas formed on the n-type contact layer 7 is an n-electrode layer 5. The surface of the compound semiconductor layer 6 is covered with an insulating film 22, except for areas on which the p-electrode layer 4 and the n-electrode layer 5 are formed.

The buffer layer 21 is formed by crystal growth directly on the sapphire substrate 20. The buffer layer 21 does not require to be doped with impurities. However, there is a case in which the buffer layer 21 is doped with n-type impurities, such as germanium (Ge), at about $2 \times 10^{18}$ cm$^{-3}$. The growth temperature of the buffer layer 21 is, for example, about 1000 to 1100° C.

A structure used for the light emitting layer 9 is a SQW structure obtained by laminating an InGaN-made quantum well layer having a film thickness of several nanometers and undoped-InGaN-made barrier layers having a film thickness of several nanometers provided on both sides of the quantum well layer. Or, the layer 9 is a MQW structure obtained by laminating quantum well layers and barrier layers to one another. The growth temperature of the laminated structure is about 700 to 800° C.

The p-type semiconductor layer 10 is formed by doping a GaN-based semiconductor layer with p-type impurities, such as germanium or zinc, in impurity concentration from about $4 \times 10^{18}$ to $1 \times 10^{20}$ cm$^{-3}$. The p-type contact layer 11 is formed by doping a GaN-based semiconductor layer with p-type impurities, such as Mg, at about $1 \times 10^{19}$ cm$^{-3}$ in impurity concentration. The growth temperature is about 1000 to 1100° C. The p-electrode layer 4 is formed on the p-type contact layer 11.

The p-electrode layer 4 is formed by laminating a p-type ohmic electrode layer and a highly reflective electrode layer, with a thermal treatment. The p-type ohmic electrode layer requires a low contact resistance with the p-type semiconductor layer 10. Thus, a platinum group such as Pt, Ru, Os, Rh, Ir, Pd, etc. or Ag is preferable. Ag is preferable in view of refractive index because it exhibits a high refractive index. The highly reflective electrode layer is also formed with Ag or the like.

The n-type semiconductor layer 8 is formed by doping a GaN-based semiconductor layer with n-type impurities (such as Si) at a doping amount smaller than the n-type contact layer 7.

The n-type contact layer 7, having a higher n-type impurity concentration than that of the n-type semiconductor layer 8, is in ohmic contact with the n-electrode layer 5. The n-type contact layer 7 is formed by doping a GaN-based semiconductor layer with a large amount of Si.

The n-electrode layer 5 requires a material to be in ohmic contact with the n-contact layer 7. Ti/Al or Ti/Al/Ni/Au is preferable.

As shown in FIGS. 1 and 2, the surface of the compound semiconductor layer 6 is covered with the insulating film 22. There is thus no concern that the n-electrode layer 5 and the p-electrode layer 4 are electrically connected to each other even though both are provided on the same main surface side of the sapphire substrate 20.

SiO$_2$ is preferable for the insulating film 22 which may be formed by either CVD or PVD. The insulating film 22 may be formed with SiN. However, it requires a film thickness of 100 nm or less due to high film stress.

A pad electrode (not shown) is formed on each surface of the p-electrode layer 4 and the n-electrode layer 5, in order to achieve higher contactability with bumps or Au wirings. It is preferable that the topmost layer of the pad electrode is Au with a film thickness of about 100 nm or more. A clean-room process ends by the formation of the topmost layer. With the end of the clean-room process, the fabrication of the semiconductor light emitting device of FIG. 1 is completed.

FIGS. 3 and 4 show an example of a fabrication process of the semiconductor light emitting device according to this embodiment. Firstly, the compound semiconductor layer 6 having the structure of FIG. 2 is formed on the sapphire substrate 20. In FIG. 3, although the compound semiconductor layer 6 is shown in simplified form, the layer 6 practically has the same structure as FIG. 2, with the p-electrode layer 4 and the n-electrode layer 5 formed thereon. The compound semiconductor layer 6 is bonded to an adhesive sheet 30, with the sapphire substrate 20 over the sheet 30. The compound semiconductor layer 6 is then diced into individual light emitting devices by use of a laser dicer, a scriber, etc. Each diced chip is referred to as a light emitting section in this specification. The light emitting section has the sapphire substrate 20 and the compound semiconductor layer 6 formed thereon.

Next, as shown in FIG. 3(a), a protective film 31 is applied on at least the side faces of the compound semiconductor layer 6 and the sapphire substrate 20, preferably their side faces and also the upper surface of the sapphire substrate 20 in each diced light emitting section. The protective film 31 is then dried. The protective film 31 is preferably a photoresist soluble in an organic solvent, or PVA (PolyVinyl Alcohol) or PMMA (Polymethylmethacrylate Resin) soluble in boiling water.

As shown in FIG. 2, the p-electrode layer 4 and the n-electrode layer 5 have been formed on the surfaces of the compound semiconductor layer 6 having the protective film 31 formed thereon. Bumps 3 are then formed on the p-electrode layer 4 and the n-electrode layer 5 and connected to the sub-mount substrate 1 (FIG. 3(b)). In FIG. 3(b), the bonding metal layer 2 is omitted for simplicity. The material of the bumps 3 is preferably Au. Wire bonding is, however, more preferable in view of operational efficiency than the bumps 3.

A bonding metal layer made of AuSn or the like requires to be preliminarily formed on the sub-mount substrate 1 in conformity to the bonding locations of the bumps 3. Via the bonding metal layer, the compound semiconductor layer 6 and the sub-mount substrate 1 are bonded to each other by thermal compression boding.

Next, as shown in FIG. 3(c), an underfill material 32 is filled into the gap between the compound semiconductor layer 6 and the sub-mount substrate 1 bonded to each other. The underfill material 32 is preferably a resin such as an epoxy- or silicon-based resin.

Next, as shown in FIG. 4(a), after the underfill material 32 is thermally cured, the protective film 31 is removed by a solvent or boiling water. The material of the underfill material 32 requires to be selected so as not to be dissolved when the protective film 31 is removed.

By removing the protective film 31, a rib portion 32a is formed along the edge of the underfill material 32. The compound semiconductor layer 6 and the sub-mount substrate 1 are then provided inside of an area surrounded by the rib portion 32a. The rib portion 32a of the underfill material 32 is not in contact with both of the edge of the compound semiconductor layer 6 and the edge of the sub-mount substrate 1. This is a structural feature of the underfill material 32.

Next, as shown in FIG. 4(b), a laser beam (such as a KrF laser beam) is emitted to the sapphire substrate 20 from the rear side (the upper side in FIG. 4(b)) to peel of the sapphire substrate 20 by the laser lift-off method. The laser power density is preferably about 0.65 to 0.80 J/cm$^2$ although it depends on the area of the compound semiconductor layer 6, the in-plane intensity distribution of the laser beam or the beam area.

As described above, the rib portion 32a of the underfill material 32 is not in contact with the edge of the sub-mount substrate 1. There is thus no concern that an excessive force is applied when the sapphire substrate 20 is peeled off by the laser lift-off method. Accordingly, no damage is given to the compound semiconductor layer 6.

Next, as shown in FIG. 4(c), dry etching such as ICP-RIE or wet etching with a strong alkaline solution is carried out to the buffer layer 21 and the n-type contact layer 7 of the exposed compound semiconductor layer 6, thereby making the rough surface of the n-type contact layer 7.

In the process of making the rough surface, it is preferable to roughly etch to the extent that the buffer layer 21 disappears and hence the n-type contact layer 7 becomes the topmost surface. With this process of making the rough surface, the light extraction efficiency is enhanced and the optical output of the semiconductor light emitting device is increased.

In addition to the process of making the rough surface, it is also preferable to perform a process of relaxing the refractive index difference of the light extraction surface 12. For example, when the insulating film 13 is applied on the n-type contact layer 7 having the rough surface, a further increase in optical output is achieved. The insulating film 13 for relaxing the refractive index difference preferably has a film thickness of 50 to 200 nm, a refractive index of 16 to 25, and a transmittance of 80% or higher.

The semiconductor light emitting device having the structure of FIG. 1 is obtained through the foregoing processes. As described above, a particularly unique structure lies in the rib portion 32a of the underfill material 32. The rib portion 32a is obtained by removing the protective film 31 in the process of FIG. 4(a). The rib portion 32a is provided outside the edge of the light emitting section, and hence never be in contact with the side faces of the compound semiconductor layer 6 and the sapphire substrate 20.

When the semiconductor light emitting device of FIG. 1 is completed, a packaging process is performed. FIG. 5 is a sectional view of the packaged semiconductor light emitting device. A resin (first resin) 33 doped with a fluorescent material is applied between the rib portion 32a of the underfill material 32 and the side faces of the compound semiconductor layer 6. Moreover, the compound semiconductor layer 6 and the underfill material 32 are covered with a doom-like sealing resin (second resin) 34. It is also preferable to dope the sealing resin 34 with a fluorescent material.

The compound semiconductor layer 6 according to the present embodiment is suitable for light emission in a so-called blue region at 405 to 470 nm in light emission wavelength. In this light emission wavelength, the fluorescent material is preferably YAG (Yttrium Aluminum Garnet) or SOSE (Strontium Barium Orthosilicate Europium). Light emission of white color is also feasible by a combination of the compound semiconductor layer 6 and the fluorescent material in the blue region.

When the light emission wavelength of the compound semiconductor layer 6 is shorter than 405 nm, the deterioration rate of the sealing resin 34 is extremely high. On the other hand, when the wavelength is longer than 470 nm, the excitation efficiency of a fluorescent material in yellow color is deteriorated, and the fabrication of white LEDs becomes difficult due to color mixture. For this reason, in this embodiment, the light emission wavelength is preferably 405 to 470 nm, as described above.

Moreover, by providing the fluorescent material, light can be emitted from the light emitting layer 9 in the direction of the side faces of the compound semiconductor layer 6, thus enhancing light emission efficiency.

In selection of the material of the underfill material 32 described above, it is necessary to pay attention to the hardness and viscosity of the material. The criterion of hardness is that a GaN thin film does not crack by the irradiation impact of a KrF laser beam. In general, with a resin 33 of low hardness, a GaN thin film cracks by the irradiation impact of a KrF laser beam. As a result of experiments by the present inventor concerning the hardness on several types of the resin 33, it was found that the hardness of about D60 to D85 is preferable for an epoxy-based resin 33.

There are two criteria concerning the viscosity. One of the criteria is that there is no gap (void) between the AlN-made sub-mount substrate 1 and the compound semiconductor layer 6. The other is that creeping-up of the resin 33 towards the sapphire substrate 20 side is restricted as much as possible.

As a result of experiments by the inventor concerning the viscosity on several types of the resin 33, it was found that the viscosity of about 0.8 to 1.4 Pa·s is preferable.

When the semiconductor light emitting device of FIG. 1 was fabricated with the underfill material 32 made of the material selected according to the criteria described above, a height h of the rib portion 32a of the underfill material 32 fell into the range of 5 µm<h<100 µm. The thickness of the sapphire substrate 20 was 100 to 150 µm. The thickness of the sub-mount substrate 1 was about 5 µm. The distance from the inner wall of the rib portion 32a to the compound semiconductor layer 6 was about 20 µm.

As described above, in this embodiment, the underfill material 32 is provided with the rib portion 32a so that the underfill material 32 via which the compound semiconductor layer 6 is bonded to the sub-mount substrate 1 is not in contact with the side faces of the compound semiconductor layer 6 and the sapphire substrate 20. Thus, when the sapphire substrate 20 is peeled off by the laser lift-off method, there is no problem in which an excess force is required for peeling off the sapphire substrate 20 due to the contact between the underfill material 32 and the sapphire substrate 20. Therefore, the compound semiconductor layer 6 can be protected from being damaged when the sapphire substrate 20 is peeled off.

Moreover, a space for filling the fluorescent material is obtained between the rib portion 32a of the underfill material 32 and the compound semiconductor layer 6. Therefore, the light leaked in the direction of the side face from the compound semiconductor layer 6 can be brightened with the fluorescent material, thereby increasing the optical output.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor light emitting device, comprising:
   a support substrate;
   a light emitting element including a nitride-based group III-V compound semiconductor layer contacted via a bump on the support substrate;
   an underfill material disposed between the support substrate and the light emitting element in a direction to be laminated, the underfill material comprising a rib portion disposed outside of a side face of the light emitting element without contacting the side face of the light emitting element in a direction of a surface of the support substrate to surround the side surface of the light emitting element;
   a first resin including a fluorescent material, the first resin being disposed on the underfill material and inside of the rib portion to cover at least a portion of the side face of the light emitting element; and a package which covers a surface of the light emitting element and inside of an outside end face of the rib portion, the package being made of a second resin including a fluorescent material.

2. The device of claim 1, wherein the underfill material is an epoxy-based resin with a hardness of D60 to D85 and a viscosity of 0.8 to 14 Pa·s.

3. The device of claim 1, wherein the rib portion has a tapered shape in which a sectional area of the rib portion becomes smaller continuously away from the light emitting element.

4. The device of claim 1, wherein an inside wall of the rib portion is disposed opposite in parallel to a sidewall of the light emitting element.

5. The device of claim 1, wherein the underfill material is closely disposed to the support substrate, the bump and the light emitting element.

6. The device of claim 1, wherein the light emitting element comprises a p type electrode and an n type electrode each provided on one or another of opposite surfaces of the support substrate, the p electrode and the n electrode being contacted with the support substrate via separate bumps.

7. The device of claim 1, wherein a light extraction surface roughly processed is provided on a surface opposite to the support substrate in the light emitting element.

8. A semiconductor light emitting device, comprising:
a support substrate;
a light emitting element including a nitride-based group III-V compound semiconductor layer contacted via a bump on the support substrate;
an underfill material disposed on the support substrate to contact the support substrate, the light emitting element and the bump, the underfill material comprising a rib portion disposed outside of an end face of the light emitting element to surround the end surface of the light emitting element;
a first resin including a fluorescent material, the first resin being disposed on the underfill material and inside of the rib portion to cover at least a portion of the end face of the light emitting element; and
a package which covers a surface of the light emitting element and inside of an outside end face of the rib portion, the package being made of a second resin including a fluorescent material.

9. The device of claim 8, wherein the underfill material is an epoxy-based resin with a hardness of D60 to D85 and a viscosity of 0.8 to 14 Pa·s.

10. The device of claim 8, wherein the rib portion has a tapered shape in which a sectional area of the rib portion becomes smaller continuously away from the light emitting element.

11. The device of claim 8, wherein an inside wall of the rib portion is disposed opposite in parallel to a sidewall of the light emitting element.

12. The device of claim 8, wherein the underfill material is closely disposed to the support substrate, the bump and the light emitting element.

13. The device of claim 8, wherein the light emitting element comprises a p type electrode and an n type electrode each provided on one or another of opposite surfaces of the support substrate, the p electrode and the n electrode being contacted with the support substrate via separate bumps.

14. The device of claim 8, wherein a light extraction surface roughly processed is provided on a surface opposite to the support substrate in the light emitting element.

* * * * *